United States Patent
Fröhlich et al.

(10) Patent No.: US 8,063,700 B2
(45) Date of Patent: Nov. 22, 2011

(54) AMPLIFIER ARRANGEMENT AND METHOD FOR AMPLIFYING A SIGNAL

(75) Inventors: Thomas Fröhlich, Wattwil (CH); Nicole Heule, Jona (CH)

(73) Assignee: austriamicrosystems AG, Unterpremstätten (AT)

( * ) Notice: Subject to any disclaimer, the term of this patent is extended or adjusted under 35 U.S.C. 154(b) by 17 days.

(21) Appl. No.: 12/530,602

(22) PCT Filed: Feb. 21, 2008

(86) PCT No.: PCT/EP2008/052144
§ 371 (c)(1),
(2), (4) Date: Jan. 19, 2010

(87) PCT Pub. No.: WO2008/110444
PCT Pub. Date: Sep. 18, 2008

(65) Prior Publication Data
US 2010/0148876 A1  Jun. 17, 2010

(30) Foreign Application Priority Data
Mar. 9, 2007 (DE) .................. 10 2007 011 715

(51) Int. Cl.
*H03F 1/36* (2006.01)
(52) U.S. Cl. .......................... 330/85; 330/261
(58) Field of Classification Search ............... 330/85, 330/141, 281
See application file for complete search history.

(56) References Cited

U.S. PATENT DOCUMENTS

| | | | |
|---|---|---|---|
| 4,074,204 A | 2/1978 | Broburg et al. | |
| 5,371,479 A | 12/1994 | Hagerty | |
| 6,552,605 B1 * | 4/2003 | Yoon | ........................ 330/85 X |
| 6,590,447 B1 | 7/2003 | Willis | |
| 7,180,369 B1 | 2/2007 | Cui et al. | |
| 2007/0040609 A1 | 2/2007 | Taylor | |
| 2008/0036540 A1 | 2/2008 | Frohlich | |

FOREIGN PATENT DOCUMENTS

| | | |
|---|---|---|
| EP | 1 143 602 | 10/2001 |
| GB | 2 261 785 | 5/1993 |
| JP | 58-92113 | 6/1983 |
| JP | 59-56824 | 4/1984 |
| WO | WO 00/44090 | 7/2000 |
| WO | WO 2006/062941 | 6/2006 |

OTHER PUBLICATIONS

U. Tietze et al., "Halbleiter-Schaltungstechnik", 11$^{th}$ Edition, Springer-Verlag, Berlin, 1999, pp. 862-882 and 888-893, ISBN 3-540-64192-0.

"Datasheet OP-27", 2006, Analog Devices, XP002488697.

* cited by examiner

*Primary Examiner* — Steven J Mottola
(74) *Attorney, Agent, or Firm* — Cozen O'Connor

(57) ABSTRACT

An amplifier arrangement has an amplifier (3) with a signal input (31), a feedback input (32) and a signal output (33). A first coupling path (FB1), which has a first impedance element (R1), connects the feedback input (32) to the signal output (33). A second coupling path (FB2) has a filter device (4), a buffer circuit (5) and a second impedance element (R2) connected in series, and connects the feedback input (32) to the signal output (33) or to the signal input (31).

16 Claims, 3 Drawing Sheets

AMPLIFIER ARRANGEMENT AND METHOD FOR AMPLIFYING A SIGNAL

RELATED APPLICATIONS

This is a U.S. national stage of application No. PCT/EP2008/052144, filed on Feb. 21, 2008.

This application claims the priority of German application no. 10 2007 011 715.0 filed Mar. 9, 2007, the entire content of which is hereby incorporated by reference.

FIELD OF THE INVENTION

The present invention relates to an amplifier arrangement and a method for amplifying a signal.

BACKGROUND OF THE INVENTION

For example, MEMS (micro electro mechanical systems) applications frequently require signal amplifiers having a small space requirement, low input capacitance, high input impedance, a low current requirement and low noise. A rail-to-rail AB output stage, current feedback and input signal levels up to the supply voltage, for example, an input signal referencing a negative or supply potential, are also desirable.

Typically, a sufficient gain can be provided with a differential amplifier, which comprises a voltage divider with feedback on its output side.

However, with typical applications, a voltage offset or low frequency noise is present to some extent at the input of such an amplifier. For example, with such amplifiers, a changing voltage offset of a variable input signal is also amplified. This can lead to, among others, a degradation of the signal quality in the amplified output signal. In addition, the current consumption in the amplifier is increased due to the amplification of the low frequency noise or of the voltage offset.

Low frequency components can be suppressed, for example, through capacitive decoupling. For this however, it is necessary, depending on a desired frequency suppression, to use relatively large capacitance values, which increases the cost of such an amplifier circuit, or alternatively, larger resistance values for the voltage divider, which negatively impact the noise performance of the amplifier circuit.

SUMMARY OF THE INVENTION

One object of the invention is to provide an amplifier arrangement and a method for amplifying a signal, in which frequency dependent signal amplification can be attained with low noise and at low cost.

In an exemplary embodiment, an amplifier arrangement has an amplifier with a signal input, a feedback input, and a signal output. Further provided are a first coupling path, which has a first impedance element and which connects the feedback input to the signal output, and a second coupling path, which has a filter device, a buffer circuit and a second impedance element connected in series, and which connects the feedback input to the signal output or to the signal input.

A transfer function, for example, a gain of the amplifier arrangement, can be defined via the first and the second impedance element in the first and second coupling path. The first and the second impedance elements can each comprise a resistor. Alternatively, the impedance elements can also have capacitive properties, or a combination of capacitive and resistive, or ohmic properties. In addition, the filter device in the second coupling path makes it possible that undesired frequency components in a respective signal, which is supplied to the feedback input of the amplifier, are suppressed. The buffer circuit in the second coupling path makes it possible that a first loop signal in the first coupling path only minimally affects a second loop signal in the second coupling path.

The impedance values, or resistance values, of the first and second impedance elements can be chosen to be relatively low so that the noise level of the amplifier arrangement also remains low.

The second coupling path can be built as a feedback path, which connects the signal output of the amplifier, which typically also forms the signal output of the amplifier arrangement or is coupled to it, to the feedback input. Alternatively, the second coupling path can also be built as a forward coupling, which connects the signal input of the amplifier to the feedback input. Thus, a frequency dependent amplification of an input signal can be attained by appropriate processing of the input signal or also by processing of the output signal of the amplifier arrangement.

In one embodiment, the filter device has a low pass filter. Here, the low pass filter can comprise, for example, an RC circuit. However, the low pass filter can also be built as an active filter.

The filter device in different embodiments can also have filter properties other than a low pass filter. For example, the filter device can be built also as a high pass filter, as a band pass filter or as a band stop filter. In addition, in another embodiment it is possible that the filter device has an arbitrary filter function. In the different embodiments, the filter device can be built with active as well as with passive filters.

In a further embodiment, the second coupling path has a voltage source. Due to the voltage source, for example, a fixed, predetermined voltage offset can be attained in the output signal of the amplifier arrangement. Thus, an output signal can be generated that oscillates about the voltage value specified by the voltage source, by the two impedance elements, and by the DC input level at the signal input, for the case that an input signal to the amplifier arrangement has an oscillation. An amplifier according to this embodiment can also be designated as an amplifier with rail-to-rail output.

In a further embodiment the amplifier comprises multiple amplifier stages. For example, the amplifier comprises an input stage, which has a transistor, which is connected to the signal input and via an impedance element to the signal output, and at least one output stage, which is connected on the input side to the transistor and on the output side to the signal output. An input signal can be supplied via the signal input to the transistor at an input, for example, at the control input. An output of the input stage, which is formed by a further connection of the transistor, is coupled where appropriate via further components or function blocks to an input of the output stage. The output stage provides an output signal which is derived from the input signal of the input stage, and is amplified. An output of the output stage is coupled at least via the first coupling path to the feedback input of the input stage, which is formed, for example, by a further connection of the transistor. Thus, the first and possibly the second coupling path include not only the output stage, but rather, connect the output of the output stage back to the transistor.

In this embodiment, the noise is significantly reduced already in the input stage due to signal amplification. Due to the closed control loop the linearity is high. Temperature dependent variation, process dependent variation and supply voltage dependent variation are low.

Preferably, the transistor of the input stage is connected such that an input for supplying the input signal of the amplifier arrangement is formed at a control input of the transistor.

The connections of the controlled section of the transistor are preferably connected such that one of the connections forms an output of the input stage and is connected to the output stage, and a further connection of the controlled section of the transistor of the input stage is connected to the first and the second coupling path.

The transistor is preferably built as a pMOS transistor. However, implementation using an nMOS transistor is also possible.

The output stage, too, can similarly comprise at least one transistor. In one embodiment, for example, the output stage is a class AB stage. In a further embodiment, the input stage comprises a resistor, which couples a connection of the controlled section of the transistor to a supply potential connection or to a reference potential connection. Using the resistance, for example, the gain of the input stage can be adjusted. An input stage can comprise, in addition or alternatively, a bias current source, which is connected to the transistor.

In one embodiment, the input stage comprises a current path, which is switched between a supply and reference potential connection. For example, the bias current source, the transistor and the resistor of the input stage are arranged in the same current path.

In one exemplary embodiment of a method for amplifying a signal, an input signal is amplified depending on the first and the second loop signal, and an output signal derived from the input signal is made available. The first loop signal is derived from the output signal, depending on a first impedance. An intermediate signal is derived through filtering and buffering of the input signal or the output signal. A derivation of the second loop signal is effected from the intermediate signal, depending on a second impedance.

Through the amplification of the input signal, depending on the first and second loop signal, a transfer function between amplified output signal and input signal can be controlled through appropriate processing of the loop signal. In particular, the second loop signal, which is derived through filtering and subsequent buffering of the input signal or of the output signal, can be used for a frequency dependent amplification of the input signal. For example, due to the filtering, frequency components in the input signal or the output signal are suppressed, such that the loop signals, in particular the second loop signal, causes a desired frequency behavior during amplification of the input signal. Due to the buffering, the filtered signal, or the filtering of the signal respectively, is decoupled from the amplification or from the impedance based derivation of the loop signals.

In one embodiment of the method, the derivation of the first and/or the second loop signal occurs based on resistance. Thus, the first and/or the second loop signal are derived depending on a respective resistance value. For example, the amplification properties, such as a gain factor of the amplifier arrangement, depend on an impedance ratio of the first and second impedance, or a resistance ratio of the first and second resistance value. Here, the impedances or resistance values can be selected as low values such that the noise can also be kept low during amplification.

In a further embodiment the filtering has a low pass response. Alternatively, the filtering can also have any other desired filter properties, such as, high pass, band pass, band stop properties or a combination thereof. Therefore, the amplification of the signal can occur with an arbitrary dependency on the frequency.

In a further embodiment of the method, the derivation of the intermediate signal involves the application of an offset signal to the intermediate signal. With the offset signal, which for example, is an offset voltage or an offset current, a fixed base value can be generated in the amplified output signal, which serves for example, as a base value for possible oscillations in the amplified output signal.

In one embodiment of the method, the amplification and the provision comprise an amplification of the input signal with a transistor, provision of a further intermediate signal derived from an input signal, amplification of the further intermediate signal, and provision of the output signal derived from the further intermediate signal.

Here, the first and second loop signals are fed back to the transistor.

For example, the further intermediate signal is tapped at a connection to a controlled section of the transistor. In this case, the first and second loop signals are fed back to another connection of the controlled section of the transistor.

In one embodiment, a bias current is supplied to the transistor for the amplification. In addition, with a resistor connected at the transistor, a gain of an input stage including the transistor can be adjusted.

BRIEF DESCRIPTION OF THE DRAWINGS

In the following, the invention is explained in more detail using several exemplary embodiments based on the Figures. Here, functionally equivalent elements or elements having the same effect have the same reference number.

DETAILED DESCRIPTION OF THE DRAWINGS

Figure 1:
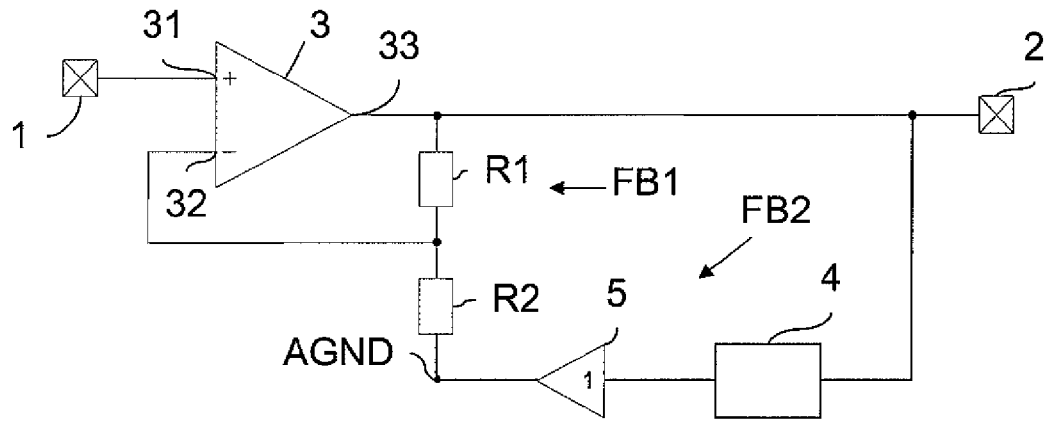
FIG. 1 shows a first exemplary embodiment of an amplifier arrangement.

FIG. 1 shows a first exemplary embodiment of an amplifier arrangement. The amplifier arrangement comprises an amplifier 3 with a signal input 31, which is connected to an input 1 of the amplifier arrangement, a feedback input 32, and a signal output 33, which is connected to an output 2 of the amplifier arrangement.

A first coupling path FB1, which has an impedance R1 implemented as a resistor, connects the signal output 33 to the feedback input 32. Furthermore, a second coupling path FB2 is provided which in the case of this exemplary embodiment also connects the signal output 33 to the feedback input 32.

In this exemplary embodiment, the first and second coupling paths FB1, FB2 are designed as feedback paths, which feed the output signal of the amplifier back to the feedback input 32 of the amplifier 3 after processing.

The second coupling path FB2 comprises a series connection of a filter device 4, a buffer circuit 5, and an impedance R2, again embodied as a resistor. A connection node between the second resistor R2 and the buffer circuit 5 represents a reference node AGND for a virtual reference potential.

The buffer circuit 5, which is preferably arranged after the filter device, comprises, for example, a unit amplifier, that is, an amplifier with a gain that corresponds essentially to a factor of 1. Alternatively, the buffer circuit can also comprise an amplifier with a different fixed gain. In further embodiments, the buffer circuit 5 can also be implemented differently, and serves primarily to isolate, or decouple, the filter device 4 and the feedback input 32 from each other with respect to current. As a result, due to the buffer circuit 5, the resistor R2 is isolated from the filter device 4 such that no impact on the filtering of the filter device 4 can occur on a direct path through the resistors R1, R2.

A base gain of the amplifier device, for example, for signals with frequencies which are not suppressed by the amplifier device, can be adjusted using a resistance ratio of the resistors R1, R2.

In a conventional amplifier arrangement, an appropriate resistor R2 is connected to a resistor R1 and to a connection with a fixed reference potential, typically a ground potential. A total gain of the conventional amplifier arrangement remains the same in the context of the amplifier used in each case. In the amplifier arrangement shown in the exemplary embodiment, the resistor R2 is connected to the AGND connection, at which a potential is present that changes depending on the output signal.

Thus an intermediate signal, from which the potential at the connection AGND results, is derived by means of the filter device 4 and the buffer circuit 5 from the output signal at the connection 33. For example, in FIG. 1, the potential at connection AGND and the intermediate signal are equal. A first loop signal is derived from the output signal via the resistor R1. Correspondingly, a second loop signal is derived from the intermediate signal via the resistor R2. The first and second loop signals are fed together to the feedback input 32 of the amplifier 3. Thus, amplification or processing of the input signal at input 31 occurs in accordance with the first and second loop signal, to form the amplified output signal at the signal output 33.

Due to the filter device 4, specific frequency components of the output signal are suppressed in the intermediate signal, which consequently have little or no influence on the potential at the connection AGND. Accordingly, a frequency dependent influence of the amplified output signal occurs predominantly due to the signal components in the respective pass band of the filter device 4, that is, due to the frequency components in the intermediate signal that are not suppressed.

Expressed in another way, the frequency properties of the filter device 4, which is arranged in the feedback path FB2, inversely influence the frequency behavior of the amplifier arrangement. If, for example, the filter device 4 has a low pass response, this results in a high pass for the amplifier arrangement.

Thus, through appropriate selection of the filter properties of the filter device 4, the transfer characteristics of the amplifier arrangement can be set. A base gain of the amplifier arrangement in the band pass region is determined by the resistance ratio of the resistors R1, R2. The resistors R1, R2 can be implemented with low resistance, which leads to an improved noise behavior of the amplifier arrangement.

Figure 2:
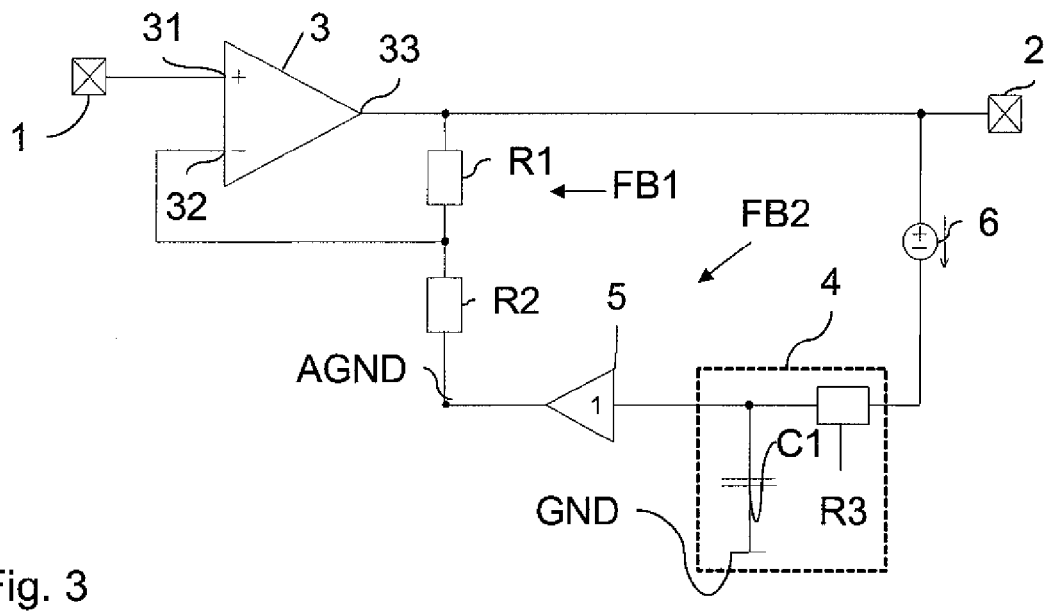
FIG. 2 shows a second exemplary embodiment of an amplifier arrangement.

FIG. 2 shows a further development of the circuit from FIG. 1, to which it corresponds to a high degree in design, the components used, their connection to each other, and the advantageous mode of operation. However, in addition, the filter device 4 is built with an RC circuit R3, C1 which comprises a resistor R3 and a capacitive element C1. Here, the resistor R3 is connected into the coupling path FB2, the capacitor C1 forms a transverse path from coupling path FB2 to a reference potential connection GND. The coupling path FB2, which again is implemented as a feedback path, additionally comprises a voltage source 6 in this exemplary embodiment.

The low pass behavior of the RC circuit R3, C1 results in a high pass response of the amplifier arrangement. Due to the voltage source 6, whose voltage remains unaffected by the filter device 4 and the downstream buffer circuit 5, the changing reference potential at the connection AGND is set to a fixed base value. Thus, a voltage offset of the amplified output signal occurs relative to a reference potential of the input signal at the signal input 31. An input signal, that oscillates, for example, about a reference voltage of zero volts, is amplified accordingly by the amplifier arrangement into an output signal which oscillates about a voltage that is derived from the voltage of the voltage source 6. For example, the average value of the oscillation corresponds to the voltage of the voltage source 6 multiplied by $R1/(R1+R2)$, where R1, R2 represent the resistance values of the resistors R1, R2. This makes it possible, for example, for the output signal to assume voltage values which are only in the positive voltage range. For this purpose, for example, the oscillation amplitude of the output signal is smaller than the voltage of the voltage source 6. Thus, the amplifier arrangement can be used, among other uses, as a rail-to-rail amplifier.

For example, in MEMS applications, it can happen that the input signal, in addition to desired oscillations, also has a DC signal component that possibly changes with low frequency. With conventional amplifier arrangements, this steady signal component, or DC offset, can lead to undesirable consequences in the output signal, for example, to exceeding the amplification range, which results in clipping of signal components.

In one exemplary embodiment, a cut-off frequency of the RC circuit R3, C1 is selected such that in the feedback path FB2 only frequency components which correspond to the low frequency voltage changes of the DC signal component in the input signal are passed. This achieves the result that these frequency components have an influence on the potential at the AGND connection, and therefore are not relevant to the amplification in the amplifier 3. As already explained, the low pass in the feedback path FB2 acts as a high pass in the amplifier arrangement, so that a changing DC offset in the input signal is suppressed in the amplified output signal.

In this exemplary embodiment, the resistor R3 can be selected to be of high resistance, so that the capacitance of the capacitor C1 can be selected to be small without changing a cut-off frequency of the RC component.

Figure 3:
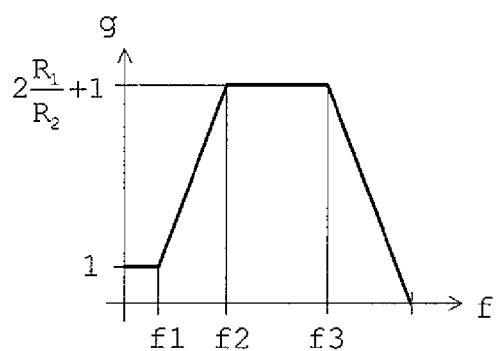
FIG. 3 shows an exemplary frequency response of an amplifier arrangement.

FIG. 3 shows an exemplary frequency response in an exemplary embodiment of an amplifier arrangement in which a filter device 4 with low pass response is provided in the feedback path FB2. Here, the low pass has a first cut-off frequency f1, which is determined, for example, in the exemplary embodiment in FIG. 2 by the component values of the resistor R3 and the capacitor C1. Above the second cut-off frequency f2, the low pass acts as a block, that is, no frequency components with a frequency greater than the cut-off frequency f2 are passed.

In the frequency response in FIG. 3, it can be seen that from the frequency of zero to the first cut-off frequency f1, a uniform gain of one results. In the frequency range between the cut-off frequency f1 and the second cut-off frequency f2, the suppression in the low pass filter increases, such that a gain g of the amplifier arrangement increases correspondingly. At the second cut-off frequency f2, a base gain or maximum gain of $2(R1/R2)+1$ is attained, where R1, R2 are again the resistance values of the resistors R1, R2.

Above a third cut-off frequency, which results from a cut-off frequency of the amplifier 3, the gain of the amplifier arrangement decreases again. However, the third cut-off frequency f3 is to a great extent independent of the circuit connection of the amplifier 3 to the first and second coupling path FB1, FB2.

The frequency response in FIG. 3 has the response of a band pass, which in essence is transmissive between the cut-off frequencies f2 and f3. In particular, frequencies below the first cut-off frequency f1 are suppressed.

Figure 4:
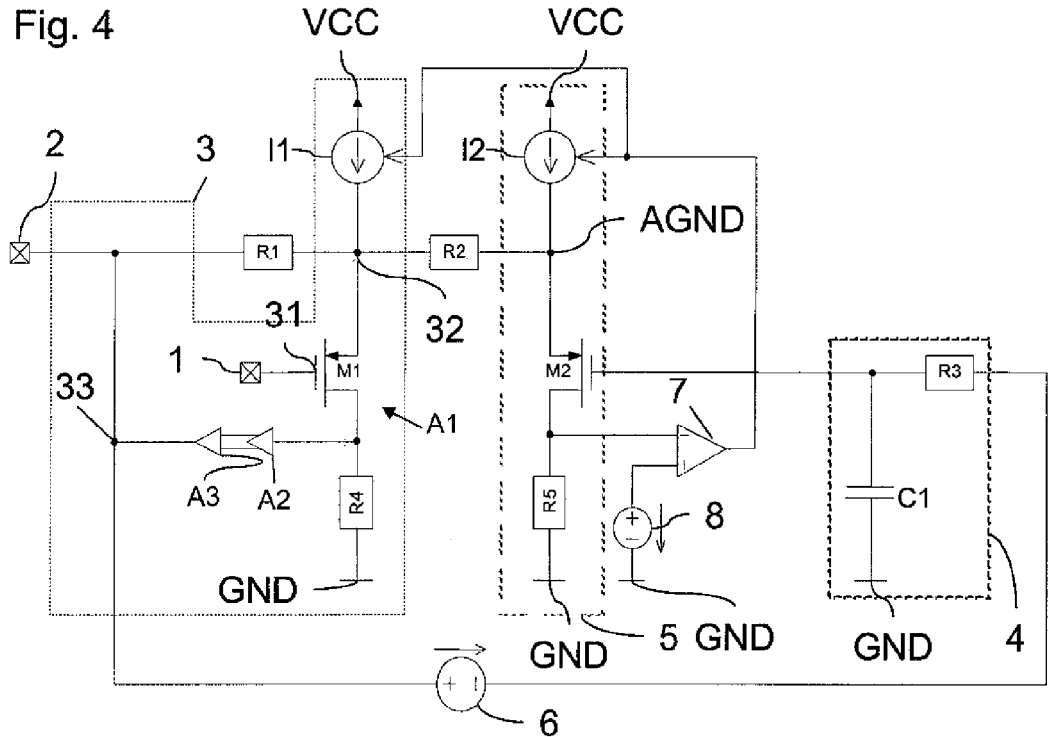
FIG. 4 shows a third exemplary embodiment of an amplifier arrangement.

FIG. 4 shows a further exemplary embodiment of an amplifier arrangement. Here, the amplifier 3 comprises an input stage A1 and two output stages A2, A3, and thus, is designed as a multistage amplifier. The input stage A1 has a pMOS transistor M1, whose control connection forms the signal input 31 that is coupled to the input 1 of the amplifier arrangement, or is connected to it. A first connection of the controlled section of the transistor M1 is coupled to the feedback input 32, and to a bias source current I1. A second connection of the controlled section of the transistor M1 is connected via a resistor R4 to the reference potential connection GND, and directly to the input of the output stage A2. Thus, the bias current source I1, the transistor M1, and the resistor R4 are arranged in a common current path. An output of the output stage A3 is coupled to the signal output 33.

The signal output 33 is coupled, as in the exemplary embodiment from FIG. 2, via a voltage source 6 and a filter device 4, built as an RC circuit, to the buffer circuit 5. In this exemplary embodiment, the buffer circuit 5 has a further pMOS transistor M2, whose control connection is connected to the output of the filter device 4. A first connection of the controlled section of the transistor M2 forms the output of the buffer circuit 5, and is connected to the node AGND with variable potential. Further, the first connection of the controlled section of the transistor M2 is connected to a second bias current source I2. A second connection of the controlled section of transistor M2 is connected via a resistor R5 to the reference potential connection GND, and directly to an inverting input (−) of an amplifier 7. The non-inverting input (+) of the amplifier 7 is supplied with a voltage from a further voltage source 8. An output of the amplifier 7 is coupled to a respective control input of the first and second bias current source I1, I2. For example, the bias current sources I1, I2 are implemented as matched pMOS current mirrors, which in each case are coupled to a supply potential connection VCC. Current control is effected by means of the amplifier 7.

The transistor M1 amplifies the input signal present at the input 1, and provides an amplified input signal at the input of the output stage A2 in the form of a further intermediate signal. This already amplified further intermediate signal is further amplified by the output stages A2, A3.

A first loop signal is on the other hand generated for the resistor R1. An intermediate signal at the connection AGND is further derived from the output signal at the signal output 33, via the filter device 4 and the buffer circuit 5, wherein the derivation of the intermediate signal includes applying to the intermediate signal an offset signal, which is provided in the form of the voltage of the voltage source 6. The second loop signal is derived from the intermediate signal via the resistor R2.

The input signal at connection 1 and the loop signals fed back at feedback input 32 can be interpreted as components of a differential signal input of the amplifier. Thus, the input stage A1 comprises a differential signal input, to which at one connection 31 the input signal, and at the second connection 32 the loop signals derived from the output signal, are supplied.

Due to the closed loop, the circuit has good linearity. Variations due to temperature fluctuations, fluctuations of the production parameters and fluctuations of the supply voltage are small.

The respective bulk connection (also known as a bulk terminal and a substrate connection) of the transistors M1, M2, which is not marked in the present figure, can be connected either to the source connection (also known as a source terminal) of the respective transistor or to a different circuit node. The connection to the source connection has the advantage that the effective gate bulk capacitance is reduced there.

Through good shielding of the signal input 31 from the feedback input 32, a very low input capacitance can be achieved or it can be further reduced. Thus, it is possible to practically eliminate the effective parasitic gate-source capacitance effective at the input 31.

The proposed circuit, which is explained as an example based on the FIGS. 1, 2, and 4, is particularly suited as an analog signal amplifier. The circuit is distinguished by low effective input capacitance, high input impedance, low current consumption, and low input noise.

The circuit in FIG. 4 is designed such that in operation with alternating current, the same constant current flows through each of the transistors M1, M2. Accordingly, with an increasing voltage at the input 1, the voltage at the feedback input 32 increases by the same amount. An associated voltage difference is effected via a current flow across the resistor R2. However, since the current through the transistor M2 is essentially constant, as previously explained, the current flow through the resistor R2 is provided by the current source I2. However, due to the coupling of the current sources I1, I2, this leads to a change in the current through the current source I1. The voltage across the resistor R2 with respect to alternating current is the same as the voltage at input 1 of the amplifier arrangement. With respect to alternating current, with the current $i_{R2}$ through the resistor R2, the equation $$i_{R2} = \frac{v_{inp}}{R_2} = -i_i, \quad (1)$$

applies, where $V_{inp}$ is the voltage at input 1, $R_2$ is the resistance value of the resistor R2, and $i_i$ is the current through the current sources I1, I2. Similarly, the equation $$i_{R2} = i_i + i_{R1}, \quad (2)$$

applies, with $i_{R1}$ as the alternating current across the resistor R1, which with equation (1) results in:

$$i_{R1} = i_{R2} - i_i = i_{R2} - (-i_{R2}) = 2 \cdot i_{R2}. \quad (3)$$

With the alternating voltage $v_{R1}$ across the resistor R1 and the voltage $v_{out}$ at the output 2, the following equation applies $$v_{out} = v_{R1} + v_{inp}. \quad (4)$$

From this, and using the equations (1) to (3), and with $R_1$ as the resistance value of the resistor R1, the following is derived $$\begin{aligned} v_{out} &= i_{R1} \cdot R_1 + v_{inp} \\ &= 2 \cdot i_{R2} \cdot R_1 + v_{inp} \\ &= 2 \cdot \frac{v_{inp}}{R_2} \cdot R_1 + v_{inp} \\ &= v_{inp} \cdot \left(2 \cdot \frac{R_1}{R_2} + 1\right). \end{aligned} \quad (5)$$

For an alternating current amplification factor, $A_{AC}$ this yields $$A_{AC} = \frac{v_{out}}{v_{inp}} = 2 \cdot \frac{R_1}{R_2} + 1. \quad (6)$$

It can be seen that the loop gain of the arrangement is greater by a factor of 2 than that of conventional amplifier arrangements. With reference to FIG. 3, this amplification factor $A_{AC}$ applies essentially for the pass band of the illustrated amplification arrangement.

Figure 5:
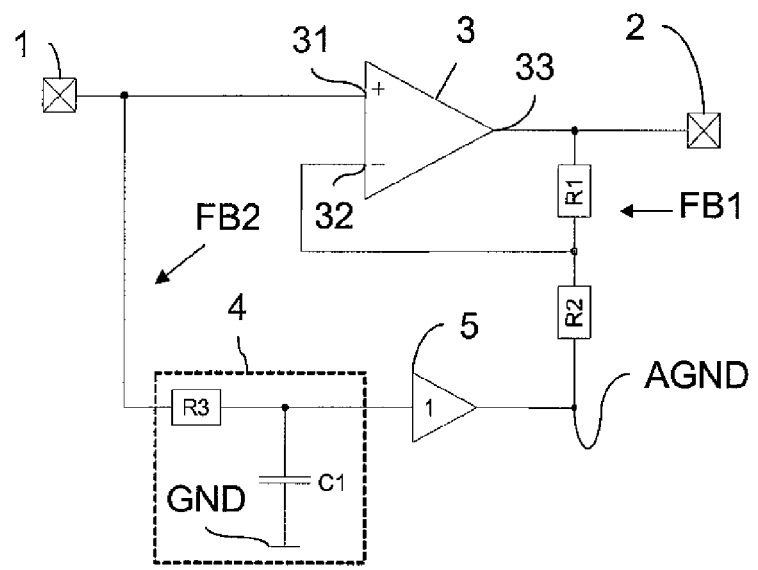
FIG. 5 shows a fourth exemplary embodiment of an amplifier arrangement.

FIG. 5 shows a further exemplary embodiment of an amplifier arrangement. In contrast to the amplification arrangement shown in FIG. 1, the second coupling path FB2 in this exemplary embodiment is arranged between the signal input 31 and the feedback input 32. A potential at the connection AGND, which again is variable, therefore depends directly on the input signal at input 1. Expressed another way, an intermediate signal is derived from the input signal at input 1 via filtering with the filter device 4 and subsequent buffering with the buffer circuit 5. The intermediate signal determines the potential at the connection AGND. An amplification factor in the amplifier arrangement of FIG. 5 is again essentially specified by the resistors R1, R2. The filter device 4, implemented as an RC low pass filter R3, C1, has the effect that here, the low frequency components in the input signal essentially result in an influence on the reference potential at the connection AGND.

The second coupling path FB2 is designed as a forward coupling path in this exemplary embodiment. Depending on the low pass properties of the filter device 4, the amplifier arrangement illustrated in FIG. 5, considering the transfer characteristics of the amplifier, has a band pass behavior.

Figure 6:
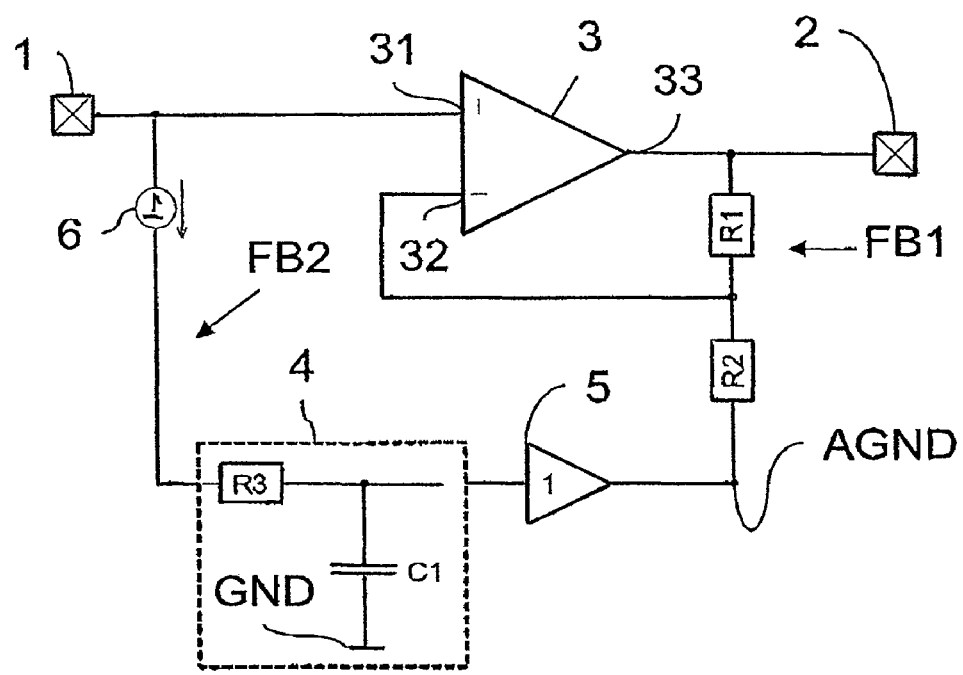
FIG. 6 shows a further embodiment of an amplifier arrangement.

FIG. 6 shows a further exemplary embodiment of an amplifier arrangement, which is based on the embodiment shown in FIG. 5. In the FIG. 6 embodiment, however, the coupling path FB2 additionally includes a voltage source 6.

The invention claimed is:

1. An amplifier arrangement, comprising:
   an amplifier with a signal input, a feedback input and a signal output;
   a first coupling path which has a first impedance element and which connects the feedback input to the signal output; and
   a second coupling path which has a filter device, a buffer circuit,
   a second impedance element and a voltage source connected in series, and which connects the feedback input to the signal output or to the signal input, wherein the series circuit is coupled via the voltage source to the signal output or to the signal input.

2. The amplifier arrangement according to claim 1, wherein the first and/or the second impedance element comprises a resistor.

3. The amplifier arrangement according to claim 1, wherein o the filter device has a low pass filter.

4. The amplifier arrangement according to claim 3, wherein the low pass filter has an RC circuit.

5. The amplifier arrangement according to claim 1, wherein the amplifier comprises several amplifier stages.

6. The amplifier arrangement according to claim 5, wherein the amplifier comprises:
   an input stage which includes a transistor connected to the signal input and to the signal output; and
   at least one output stage connected on the input side to the transistor and on the output side to the signal output.

7. The amplifier arrangement according to claim 6, wherein the input stage comprises a resistor which couples a connection of a controlled section of the transistor to a supply or reference potential connection.

8. The amplifier arrangement according to claim 6, wherein the input stage comprises a bias current source which is connected to the transistor.

9. The amplifier arrangement according to claim 7, wherein the bias current source, the transistor and the resistor of the input stage are arranged in a common current path.

10. A method for amplifying a signal, comprising the steps of:
    amplifying an input signal depending on a first and a second loop signal, and providing an output signal generated from the input signal;
    generating a first loop signal from the output signal depending on a first impedance;
    applying an offset signal to one of the input signal and the output signal;
    generating an intermediate signal by filtering and buffering one of the input signal with the offset signal being applied and the output signal with the offset signal being applied; and
    generating a second loop signal from the intermediate signal depending on a second impedance.

11. The method according to claim 10, wherein the step of generating the first and/or the second loop signal occurs based on a resistance.

12. The method according to claim 10, wherein the filtering has a low pass behavior.

13. The method according to claim 10, wherein the steps of amplifying an input signal and providing an output signal comprise amplifying the input signal with a transistor, providing a further intermediate signal generated from the input signal, amplifying the further intermediate signal and providing the output signal generated from the further intermediate signal, and wherein the first and the second loop signals are fed back to the transistor.

14. The method according to claim 13, wherein the further intermediate signal is tapped at a connection of a controlled section of the transistor, and the first and the second loop signal are fed back at a different connection of the controlled section of the transistor.

15. The method according to claim 13, wherein a bias current is supplied to the transistor.

16. The method according to claim 13, wherein an amplification of an input stage comprising the transistor is adjustable using a resistor connected to the transistor.

* * * * *